(12) United States Patent
Festag

(10) Patent No.: US 6,660,933 B2
(45) Date of Patent: Dec. 9, 2003

(54) SHIELDING ELEMENT FOR ELECTROMAGNETIC SHIELDING OF AN APERTURE OPENING

(75) Inventor: Mario Festag, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/262,146

(22) Filed: Oct. 1, 2002

(65) Prior Publication Data
US 2003/0062181 A1 Apr. 3, 2003

(30) Foreign Application Priority Data
Oct. 1, 2001 (DE) .......................... 101 49 305

(51) Int. Cl.[7] ................................. H05K 9/00
(52) U.S. Cl. ............... 174/35 GC; 174/35 R; 361/816; 361/818; 439/607
(58) Field of Search ............... 174/35 GC, 35 R, 174/35 MS; 361/816, 818; 439/607, 609, 557

(56) References Cited

U.S. PATENT DOCUMENTS

| | | | |
|---|---|---|---|
| 4,812,137 A | * | 3/1989 | Wilson et al. ............... 439/607 |
| 5,545,843 A | * | 8/1996 | Arvidsson et al. ...... 174/35 GC |
| 5,576,513 A | * | 11/1996 | Gunther et al. ........... 174/35 R |
| 5,766,041 A | * | 6/1998 | Morin et al. ................ 439/609 |
| 5,989,069 A | * | 11/1999 | Tan ............................. 439/620 |
| 6,005,186 A | * | 12/1999 | Bachman ................... 174/35 R |
| 6,093,887 A | * | 7/2000 | Ponto et al. ............... 174/35 R |
| 6,437,237 B1 | * | 8/2002 | Kurrer et al. ............. 174/35 R |
| 6,500,012 B1 | * | 12/2002 | Billenstein et al. ........... 439/92 |

FOREIGN PATENT DOCUMENTS

DE  90 04 686 U1  8/1990

* cited by examiner

Primary Examiner—Dean A. Reichard
Assistant Examiner—W. David Walkenhorst
(74) Attorney, Agent, or Firm—Laurence A. Greenberg; Werner H. Stemer; Gregory L. Mayback

(57) ABSTRACT

The invention relates to a shielding element for electromagnetically shielding an aperture opening formed, for example, in a metallic structure, a plug holder or a component housing. In the non-deflected state, a large number of conductive contact springs extend from the frame of the shielding element towards the aperture opening. The contact springs at least partially overlap one another and close the aperture opening. When a plug-in element is inserted into the aperture opening, the contact springs are deflected in the insertion direction and rest in a sprung manner on the component. The invention provides an automatically closing radio-frequency seal for an aperture opening.

31 Claims, 3 Drawing Sheets

SHIELDING ELEMENT FOR ELECTROMAGNETIC SHIELDING OF AN APERTURE OPENING

BACKGROUND OF THE INVENTION

Field of the Invention

The invention relates to a shielding element for electromagnetically shielding an aperture opening, in particular, an opening in a metallic structure, a plug holder or a component housing. The invention also relates to a shielding element for electromagnetically shielding an optoelectronic transceiver.

One known type of optoelectronic transceiver is designed for being plugged in and inserted into a housing configured on a printed circuit board. These plug-in transceivers are intended to be used with data rates of up to 10 Gbit/s. Recent modules are intended to be operated at even higher data rates. One disadvantage is that microwave effects are increased at these high data rates and frequencies. By way of example, housings for receiving plug-in, small form factor pluggable (SFP) transceivers of a small type behave like waveguides above about 11 GHz, and this leads to powerful emissions of electromagnetic radiation. In general, the frequency above which a waveguide behavior occurs depends on the size and geometry of the housings that are used.

Configurations are frequently provided in which a plug holder or a component housing, for example, a housing for holding an optoelectronic transceiver, is located within a metallic structure. The metallic structure is formed by the metallic rear wall of a computer housing. In order to insert a plug-in transceiver, or a more general form of a plug-in structure, into the associated plug holder or into a component housing, an aperture opening is formed in the metallic structure. This aperture opening corresponds to the plug holder or to the component housing. In particular, when the plug-in structure is not plugged in, that is to say when the aperture opening is open and is not closed by the plug-in structure, there is a risk of undesirable emission of electromagnetic radiation from the interior of the metallic structure to the exterior.

SUMMARY OF THE INVENTION

It is accordingly an object of the invention to provide a shielding element for electromagnetically shielding an aperture opening, which provides effective and reliable shielding of the aperture opening with respect to radio-frequency electromagnetic radiation, especially in the situation when no plug-in element is inserted into the aperture opening.

With the foregoing and other objects in view there is provided, in accordance with the invention, a shielding element for electromagnetically shielding an aperture opening and for receiving a plug-in element. The shielding element includes: a frame defining an aperture opening, and a plurality of conductive contact springs extending from the frame towards the aperture opening. In a non-deflected state, the plurality of the contact springs at least partially overlap one another and close the aperture opening. As a plug-in element is being inserted in an insertion direction into the aperture opening, the plurality of the contact springs are deflected in the insertion direction and rest in a sprung manner on the plug-in element.

In other words, a large number of conductive contact springs are formed on a frame of the shielding element, which extend into the interior of the aperture opening. In the non-deflected state, the individual contact springs at least partially overlap one another, so that the aperture opening is closed. When a plug-in element is inserted into the aperture opening, the contact springs are deflected in the insertion direction and rest in a sprung manner on the plug-in element. In the process, the contact springs preferably make electrical contact with electrically conductive structures of the plug-in element, in particular with a metallic housing or a shielding structure, so that any potential differences that occur can be dissipated.

The invention is based on the idea that when no plug-in element or plug-in structure is inserted in the aperture opening, the individual contact springs close the aperture opening, and in the process form a conductive barrier or shield for electromagnetic waves. When a component is inserted, the contact springs (which are bent inward by the plug-in element) form an effective contact for the corresponding shielding structure of the element. An automatically closing radio-frequency seal is thus provided for electromagnetic radiation, which automatically closes an aperture opening, for example, in a metallic structure, a plug holder, or component housing, when no component, for example, a plug, etc. is inserted. That is to say when the plug-in location is not in use. At the same time, a sprung, conductive contact is made with the plug-in component.

For the purposes of the present invention, the term frame should be understood as meaning any structure that is suitable for supporting and for holding contact springs that extend into an aperture opening. The frame need not in this case be completely circumferential, and in the extreme case, can be formed by just a straight web.

In one preferred refinement of the invention, groups of contact springs are provided, which each extend from one face of the frame into the interior of the aperture opening. An intermediate space is provided between the individual groups on the opened and unbent shielding element in order to ensure that the interlaced springs can be restored to their original position after the plug-in component has been withdrawn, and to prevent the springs from becoming caught. The contact springs are essentially rectangular and preferably have angled ends. The ends of opposite contact springs are preferably angled in opposite directions. This ensures that the contact springs are reliably interlaced. It is also possible for the contact springs to have different lengths, so that they can be interlaced better.

In one preferred embodiment, the frame is a hollow body formed as a cuboid casing. However, other forms may also be provided. For example, the hollow body may be in the form of a cylindrical casing. It should also be mentioned that the frame need not necessarily be designed such that it is closed. A closure for an aperture opening can also be provided, for example, by contact springs that are configured on three sides of a rectangular frame that is open on one side. The contact springs extend towards the aperture opening. In the extreme case, a closure for an aperture opening may even be provided by contact springs that are formed on only one side of a frame.

In the non-deflected state, the contact springs are preferably bent through an angle of 90° from the one end face of the hollow body. Further contact springs may be formed on the other side of the hollow body. These are bent back through an angle of approximately 180° onto the outer surface of the hollow body and are used to make contact between the shielding element and a metallic structure, in particular a metallic rear wall of a computer housing in which the aperture opening is located. The shielding element in this case is inserted into the aperture opening.

Latching hooks are furthermore preferably provided on the hollow body. These are used, for example, for connecting the shielding element to a plug holder or to a component housing. In this case, the shielding element is a separate component, which is plugged onto a plug holder or a component housing, or is connected to such elements in some other way. However, it is likewise possible for the shielding element to be part of a plug holder or of a component housing, thus representing an integrated unit with the plug holder or component housing.

In a further refinement of the invention, the frame lies essentially in the same plane as the non-deflected contact springs, and in this case, has no extent or only a short extent at right angles to this plane. In particular, the frame is a rectangular frame. A device for mounting on a further structure, in particular on a metallic rear wall, is preferably provided on the frame. This device can be, for example, contact and mounting tabs that project outward and that can be conductively adhesively bonded, soldered or welded to a metallic rear wall.

The plane in which the contact springs are located and the plane in which the contact and mounting tabs are located are in this case preferably offset with respect to one another. The contact springs are thus preferably angled away from one end face, and the contact and mounting tabs are preferably angled away from the other end face of the frame. The frame in this case forms an edge, which can be inserted in an interlocking manner into the opening in a rear wall.

The shielding element is preferably formed in one operation by bending segments of a rectangular, open material strip, with the contact springs being formed on one longitudinal face of the material strip. This ensures that they can be manufactured easily from simple geometric shapes.

The contact springs are preferably formed integrally with the shielding element. The shielding element is composed of a highly conductive material, for example a stamped sheet-metal part which is bent in some suitable manner.

It is within the scope of the invention for an additional frame to be provided for holding and/or mounting the shielding element and/or for fixing a plug-in component which is inserted into the aperture opening. A material which absorbs electromagnetic rays or an additionally shielding material, for example an EMI (electromagnetic interference) wire mesh or an EMI foam seal, may also be used.

In accordance with an added feature of the invention, the contact springs are configured into groups and each one of the groups of the contact springs includes three or four contact springs.

Other features which are considered as characteristic for the invention are set forth in the appended claims.

Although the invention is illustrated and described herein as embodied in a shielding element for electromagnetic shielding of an aperture opening, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
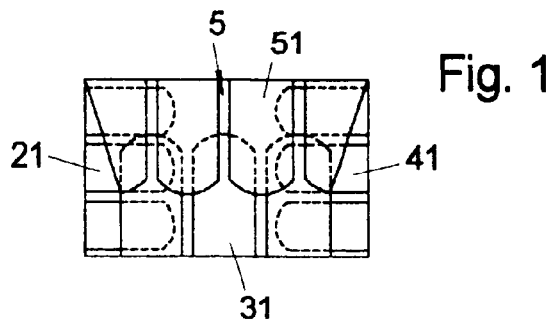
FIG. 1 is a front view of a shielding element having a number of contact springs closing an aperture opening.
Figure 2:
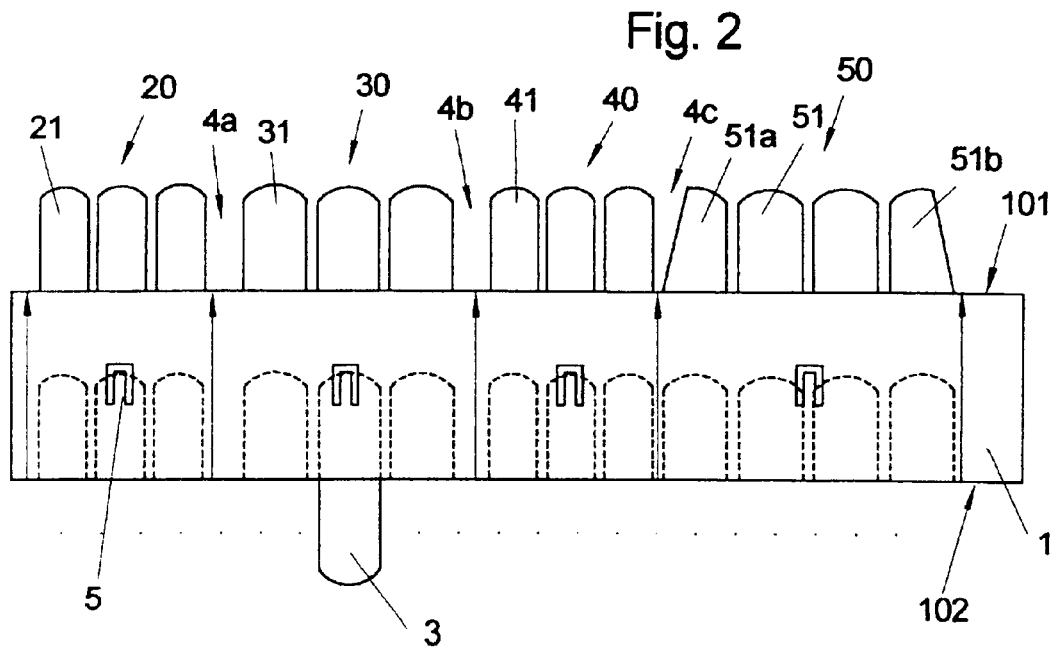
FIG. 2 is a plan view of the shielding element shown in FIG. 1, before it has been folded.
Figure 3:
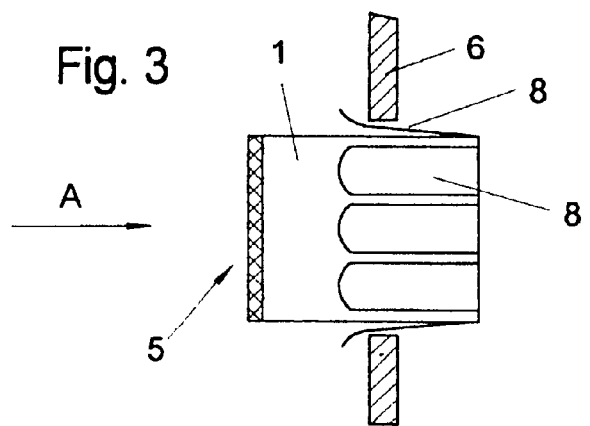
FIG. 3 is a side view of the shielding element shown in FIGS. 1 and 2.

Referring now to the figures of the drawing in detail and first, particularly, to FIGS. 1 to 3 thereof, there is shown a shielding element with a cuboid frame 1. The cuboid frame 1 has a rectangular shape in the cut-open and unwound state shown in FIG. 2. The frame 1 has a front end face 101 and a rear end face 102. There are adjacent contact springs 21, 31, 41, 51 along the front end face 101, including groups 20, 30, 40, 50 of three or four contact springs each. The contact springs have an essentially rectangular shape with a rounded end. One exception to this is the side contact springs 51a, 51b in the contact spring group 50. The outer face of each of the side contact springs 51a, 51b is inclined toward the center of the contact spring group 50.

On the other end face 102 of the frame 1, further contact springs 3 are configured in groups that correspond to the groups 20, 30, 40, 50.

As can be seen in particular from FIGS. 1 and 3, the contact springs that are configured on the front end surface 101 are bent inward at an angle of 90° with respect to the housing 1.

In this case, they lie in a plane that runs at right angles to the longitudinal direction of the frame 1.

The inward-bent contact springs partially overlap one another and thus close the opening formed by the frame 1, or an opening into which the shielding element is introduced. They thus represent a conductive barrier for electromagnetic waves which are produced by electrical components configured behind the shielding element.

When the housing is unwound, as shown in FIG. 2, intermediate spaces 4a, 4b, 4c are seen that are located between the individual contact spring groups 20, 30, 40, 50 and ensure that the contact spring groups 20, 30, 40, 50 of the completely folded frame 1 do not become caught when being moved back to the 90° closed position (after removing a plug-in element).

As shown in FIG. 3, the contact springs 3 that are configured on the rear end face 102 are bent back to approximately 180° in the direction of the outer surface of the frame 1. In this case, they point in the opposite direction to the insertion direction A of a plug-in element or component that will be inserted into the opening 5 in the shielding element. The further contact springs 3 are used to make contact with a metallic rear wall 6 which, for example, is the rear wall of a housing that surrounds a printed circuit board with electrical and optoelectronic components.

The frame 1 and the contact springs that are fitted to the front and rear end face 101, 102 are produced integrally from a stamped sheet-metal part that has a high conductivity, in order to, as reliably as possible, prevent electromagnetic rays from being emitted and to provide a good electrical link to the metallic rear wall 6.

In order to produce the shielding element, the frame 1 is folded to the desired cuboid hollow body shape, and the side ends of the hollow body are connected to one another in the process. The contact springs that are configured on the front end face 101 are bent inward through 90°, such that the contact spring groups 20 and 40 are preferably at the bottom and lie in the same plane, followed by the contact spring group 30 and finally, the contact spring group 50 is folded into the aperture opening 5 located on the outside. Other folding sequences may also be used, as alternatives, for the contact spring groups.

The contact springs 3 that are configured on the rear end face 102 are bent through 180° in the direction of the front end face 101.

Figure 4:
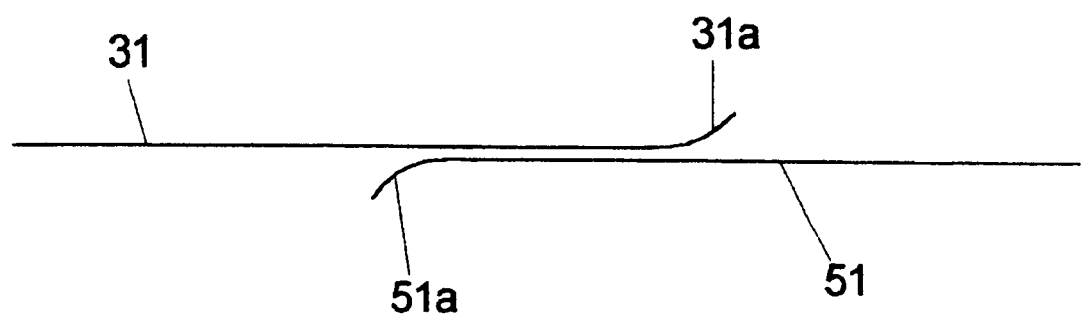
FIG. 4 schematically shows the design and intersection area of two contact springs that are located one above the other.

The overlapping ends 31*a*, 51*a* of the contact springs 31, 51 on the front end face 101 of the frame 1 are angled as shown in FIG. 4. The ends 31*a*, 51*a* of the opposite contact springs 31 51 are angled in opposite directions. This ensures that the contact springs 21, 41 and 31, 51 are interlaced reliably. A number of latching hooks 5 are formed on the frame 1, via which the shielding element can be attached to a further structure, for example, to a housing configured on a printed circuit board, or to a plug holder.

When a plug-in element (not illustrated) is being inserted in the insertion direction A into the aperture opening 5 which is closed by the contact springs 21, 31, 41, 51, the contact springs are deflected in the insertion direction A, and in the process, come into contact with the circumference of the plug-in element. In the process, they preferably make electrical contact with metallic components of the plug-in element, in particular with a metallic housing or a shielding structure. The plug-in element is preferably a plug-in optoelectronic transceiver, and the contact springs 21, 31, 41, 51 make contact, after they have been deflected, with the metallic housing and/or with some other shielding structure on the transceiver.

After withdrawing or removing the plug-in element, the contact springs 21, 31, 41, 51 automatically return to their original position because these springs have been prestressed, and in the process, form a conductive barrier, which prevents electromagnetic radiation from emerging from the opening 5.

Figure 5:
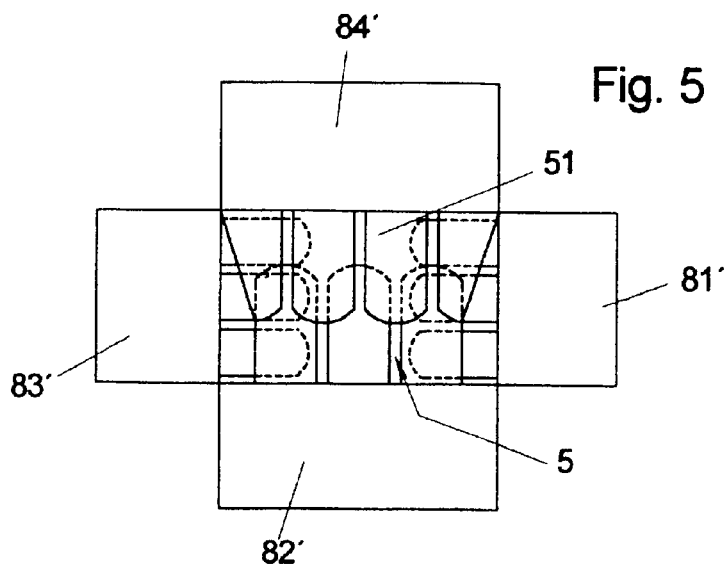
FIG. 5 is a front view of another exemplary embodiment of a shielding element.
Figure 6:
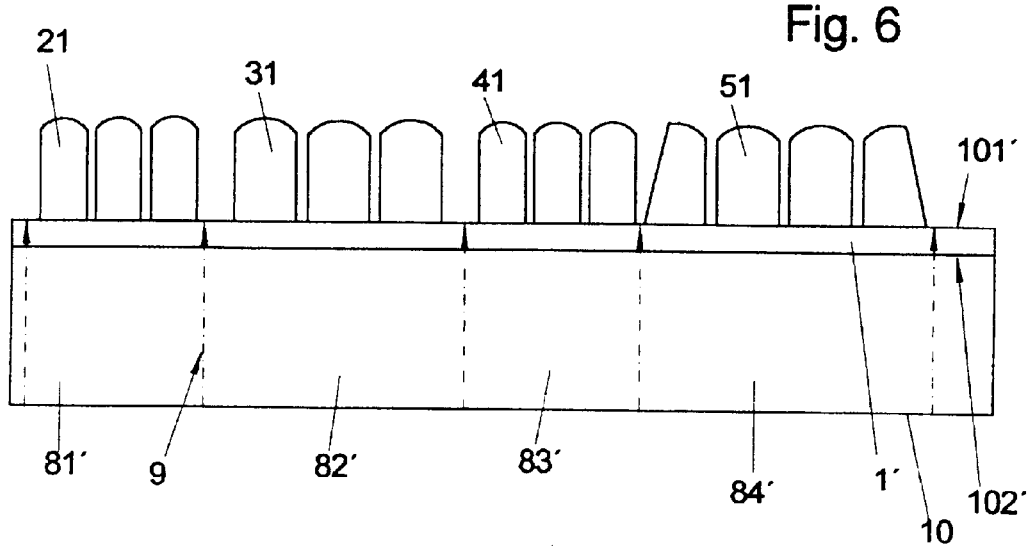
FIG. 6 is a plan view of the unbent and unfolded shielding element shown in FIG. 5.
Figure 7:
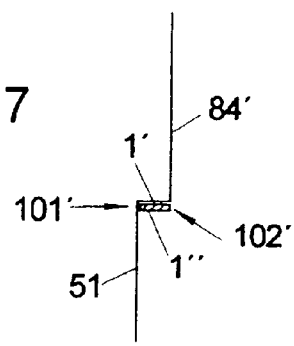
FIG. 7 is a partial sectional view through the shielding element shown in FIG. 5.

A further exemplary embodiment of the shielding element is illustrated in FIGS. 5 to 7. In this exemplary embodiment, the configurations of the contact springs 21, 31, 41, 51, which are bent-inward, is the same as in the exemplary embodiment shown in FIGS. 1 to 4, so that, to this extent, reference is made to the statements that have been made above.

In contrast to the situation in the previous figures, the frame 1' has virtually no longitudinal extent, but is located essentially in the same plane as the contact springs 21, 31, 41, 51, which are bent through 90°. The frame 1' merely forms a short straight section having one end face 101' on which the contact springs 21, 31, 41, 51 are angled, and another end face 102' on which the contact and mounting tabs 81', 82', 83', 84' are angled. The contact and mounting tabs 81', 82', 83', 84' in this case point away 5 from the aperture opening that is surrounded by the frame 1'. The contact and mounting tabs 81', 82', 83', 84' are mounted on a metallic structure, which is not illustrated but which corresponds to the structure 6 in FIG. 3. The tabs 81', 82', 83', 84 are electrically conductively connected to the metallic structure, for example, by screwing, soldering, adhesive bonding, or welding.

The projection which is formed by the frame 1' and the angled elements allows the shielding element to be inserted in an interlocking manner into a corresponding opening in a metallic structure.

The shielding element as shown in FIGS. 5 to 7 is produced in such a way that a rectangular stamped part 10 with contact springs on one end face 101' is produced first of all. The stamped part 10 in this case contains the frame 1'. The stamped part is split along cutting lines 9 as far as the rear end face 101' of the frame 1'. Once the contact springs 21, 31, 41, 51 and the contact and mounting tabs 81', 82', 83', 84' have been bent along the end faces 101' and 102', the structure illustrated in FIG. 5 is obtained.

To provide robustness and for mounting, a second frame 1', which is illustrated schematically in FIG. 7, can be inserted into the bent structure of the frame 1'.

In contrast to the situation shown in FIGS. 1 to 4 and in FIGS. 5 to 7, a shielding element is thus produced which has virtually no longitudinal extent and can thus be configured without any problems and without any physical changes in the region of an existing aperture opening, in particular, in the metallic structure. Once a plug or plug-in element has been withdrawn from the aperture opening 5, the contact springs 21, 31, 41, 51 automatically close the aperture opening, and thus represent a seal and a barrier for radio-frequency electromagnetic rays. It should be mentioned that the aperture opening is not just formed by the frame of the shielding element, but already exists, for example, in a rear wall (back plane), a housing, or a plug holder. The frame is used only as a mount for the contact springs, which seal the aperture opening against the emergence of radio-frequency radiation when the plug holder, the housing, etc. is not being used.

The embodiment of the invention is not restricted to the exemplary embodiments described above. For example, instead of a circumferential frame, an only partially circumferential frame, or in the extreme case, even only a single web, may be provided, from which contact springs extend in the direction of an aperture opening.

The only important feature for the invention is that a large number of contact springs extend from a frame in the direction of an aperture opening, with the contact springs at least partially overlapping one another in the non-deflected state, and thus shielding the aperture opening, and being deflected in the insertion direction during insertion of the plug-in element into the aperture opening, and in the process resting in a sprung manner on the component.

I claim:

1. A shielding element for electromagnetically shielding an aperture opening and for receiving a plug-in element, the shielding element comprising:

a frame defining an aperture opening; and a plurality of conductive contact springs extending from said frame towards said aperture opening;

in a non-deflected state, said plurality of said contact springs at least partially overlapping one another and closing said aperture opening; and when a plug-in element is being inserted in an insertion direction into said aperture opening, said plurality of said contact springs being deflected in the insertion direction and resting in a sprung manner on the plug-in element.

2. The shielding element according to claim 1, wherein:

said plurality of said contact springs are configured into groups of contact springs;

said frame has faces;

said aperture opening defines an interior thereof; and each one of said groups of said contact springs extend from a respective one of said faces of said frame into said interior of said aperture opening.

3. The shielding element according to claim 2, wherein: in an opened and unbent state, a respective intermediate space is located between each of said groups of said contact springs.

4. The shielding element according to claim 2, wherein: each one of said groups of said contact springs includes three of said plurality of said contact springs.

5. The shielding element according to claim 2, wherein: each one of said groups of said contact springs includes four of said plurality of said contact springs.

6. The shielding element according to claim 1, wherein: said plurality of said contact springs are essentially rectangular.

7. The shielding element according to claim 1, wherein:

said plurality of said contact springs have angled ends; and oppositely located ones of said plurality of said contact springs are angled in opposite directions.

8. The shielding element according to claim 1, wherein: some of said plurality of said contact springs have different lengths.

9. The shielding element according to claim 1, wherein: said frame is a hollow body formed as a cuboid casing.

10. The shielding element according to claim 1, wherein: said frame is a hollow body formed as a casing.

11. The shielding element according to claim 10, wherein:

said frame has faces; and in a non-deflected state, said plurality of said contact springs are bent at an angle of 90° from one of said faces of said frame.

12. The shielding element according to claim 11, comprising:

a plurality of further contact springs;

said frame having an outer surface; and said plurality of said further contact springs being bent back approximately 180° onto said outer surface of said frame.

13. The shielding element according to claim 10, comprising:

a plurality of latching hooks for connecting to a component selected from a group consisting of a component housing and a plug holder;

said plurality of said latching hooks being located on said frame.

14. The shielding element according to claim 1, wherein:

said frame lies essentially in a plane;

non-deflected ones of said plurality of said contact springs lie in the plane; and said frame has no extent at right angles from the plane.

15. The shielding element according to claim 1, wherein:

said frame lies essentially in a plane;

non-deflected ones of said plurality of said contact springs lie in the plane; and said frame has a short extent at right angles from the plane.

16. The shielding element according to claim 1, wherein:

said frame lies essentially in a plane; and non-deflected ones of said plurality of said contact springs lie in the plane.

17. The shielding element as claimed in claim 16, wherein said frame is a rectangular frame.

18. The shielding element according to claim 16, wherein: said frame includes a device for mounting on a metallic structure.

19. The shielding element according to claim 16, wherein: said frame has a plurality of contact and mounting tabs that project outward.

20. The shielding element according to claim 19, wherein:

said plurality of said contact and mounting tabs are located in a plane that is parallel and offset with respect to the plane in which said plurality of said contact springs are located.

21. The shielding element according to claim 20, wherein:

said frame has a first end face and a second end face;

said plurality of said contact springs are angled away from said first end face of said frame; and said plurality of said contact and mounting tabs are angled away from said second end face of said frame.

22. The shielding element according to claim 19, comprising:

a rectangular metal strip having bent segments forming said plurality of said contact and mounting tabs;

said metal strip having a longitudinal face with said plurality of said contact springs formed thereon.

23. The shielding element according to claim 1, wherein: said plurality of said contact springs are formed integrally with said frame.

24. The shielding element according to claim 1, comprising:

an additional frame for performing a function selected from a group consisting of holding said frame, mounting said frame, and fixing the plug-in element in said aperture opening.

25. The shielding element according to claim 1, comprising:

a material for absorbing electromagnetic rays;

said material at least partially surrounding at least one component selected from a group consisting of said frame and said plurality of said contact springs.

26. The shielding element according to claim 1, in combination with the plug-in element, wherein: the plug-in element is an optoelectronic transceiver.

27. The shielding element according to claim 26, wherein: said transceiver electrically contacts said plurality of said contact springs.

28. The shielding element according to claim 26, wherein: said transceiver has a metallic housing electrically contacting said plurality of said contact springs.

29. The shielding element according to claim 26, wherein: said transceiver has a shielding structure electrically contacting said plurality of said contact springs.

30. The shielding element according to claim 26, wherein: said frame forms part of a component selected from a group consisting of a plug holder and a component housing.

31. The shielding element according to claim 26, wherein: said frame forms part of a metallic structure.

* * * * *